(12) United States Patent
Katti

(10) Patent No.: US 7,116,575 B1
(45) Date of Patent: Oct. 3, 2006

(54) ARCHITECTURES FOR CPP RING SHAPED (RS) DEVICES

(75) Inventor: Romney R. Katti, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/087,414

(22) Filed: Mar. 23, 2005

(51) Int. Cl.
  G11C 11/00 (2006.01)
  G11C 11/14 (2006.01)
  G11C 11/15 (2006.01)

(52) U.S. Cl. .................. 365/158; 365/171; 365/173

(58) Field of Classification Search ............... None
  See application file for complete search history.

(56) References Cited

U.S. PATENT DOCUMENTS

| | | | | |
|---|---|---|---|---|
| 3,599,187 A | * | 8/1971 | Bobeck et al. | 365/138 |
| 4,103,340 A | * | 7/1978 | Fayling | 365/97 |
| 5,173,873 A | | 12/1992 | Wu et al. | 365/173 |
| 5,329,486 A | * | 7/1994 | Lage | 365/145 |
| 5,477,482 A | | 12/1995 | Prinz | 365/129 |
| 5,541,868 A | | 7/1996 | Prinz | 365/98 |
| 5,923,583 A | * | 7/1999 | Womack | 365/171 |
| 5,969,978 A | * | 10/1999 | Prinz | 365/98 |
| 6,111,784 A | | 8/2000 | Nishimura | 365/173 |
| 6,351,410 B1 | | 2/2002 | Nakao et al. | 365/171 |
| 6,542,000 B1 | * | 4/2003 | Black et al. | 326/39 |
| 6,552,554 B1 | | 4/2003 | Prinz et al. | 324/719 |
| 6,577,526 B1 | | 6/2003 | Schwarzl | 365/158 |
| 6,757,192 B1 | | 6/2004 | Mukasa et al. | 365/173 |
| 6,768,152 B1 | * | 7/2004 | Higo | 257/295 |
| 6,906,947 B1 | * | 6/2005 | Bloomquist et al. | 365/158 |
| 6,927,073 B1 | | 8/2005 | Huggins | 438/3 |
| 6,956,257 B1 | * | 10/2005 | Zhu et al. | 257/295 |
| 2006/0007728 A1 | * | 1/2006 | Sundstrom | 365/158 |

OTHER PUBLICATIONS

Zhu, "MRAM: Promises and Challenges," Electrical and Computer Engineering Nov. 2001.

* cited by examiner

Primary Examiner—Son Mai
(74) Attorney, Agent, or Firm—McDonnell Boehnen Hulbert & Berghoff LLP

(57) ABSTRACT

A current-perpendicular-to-plane (CPP) ring-shaped (RS) magnetoresistive random access memory (MRAM) element is provided in several embodiments including operational functionality of static read (SR) and dynamic read (DR). According to an embodiment, a memory element has one or more vias passing through a center hole in the CPP RS MRAM element. Each end of each via is coupled with a separate write line segment that extends radially from the center hole past a perimeter of the ring-shaped element. The write lines and vias are configured to generate magnetic fields for switching a magnetization direction of one or more layers of the ring-shaped bits in the array.

14 Claims, 11 Drawing Sheets

ARCHITECTURES FOR CPP RING SHAPED (RS) DEVICES

GOVERNMENT RIGHTS

The United States Government has acquired certain rights in this invention pursuant to Contract No. DTRA01-00-C-0002 awarded by the Defense Threat Reduction Agency.

BACKGROUND

1. Field

The present invention relates generally to magnetic memory and more specifically to magnetoresistive memory elements.

2. Related Art

In magnetoresistive random access memory (MRAM), data is stored by using an electric current to create a magnetic field for switching a magnetic direction of a ferromagnetic layer of a multilayer memory element (also known as a bit). An MRAM is described as a type of nonvolatile memory because a logical state of a memory element will persist even when power is removed from the memory device. Although there are other types of nonvolatile memories, MRAM allows rapid read and write sequences. And unlike dynamic random access memory (DRAM), MRAM does not require a constant flow of current to retain its data—thus potentially consuming less power.

Traditional MRAM elements have a rectangular shape with tapered bit ends and a linear magnetization. One type of MRAM element is a giant magnetoresistive (GMR) device that may be manufactured as a "spin valve" or "pseudo-spin valve," for instance. GMR devices, including spin valves and pseudo spin valves, can be used as data storage elements in magnetic random access memory (MRAM) devices. In this regard, exemplary MRAM applications of GMR devices are described in U.S. Pat. Nos. 6,147,922; 6,175,525; 6,178,111; and 6,493,258, all of which are incorporated herein by reference.

In the rectangular elements, magnetic poles generated at bit-ends can form demagnetizing fields within the bit and stray fields outside the bit. The demagnetizing fields can create complex magnetic domains within the bit that are detrimental to switching thresholds and data retention. The stray fields can interfere with adjacent bits. Tapering the bit ends has been useful for spreading and weakening the magnetic poles; however, problems have not been eliminated.

Ring-shaped magnetoresistive elements have been proposed as a solution to the problem of demagnetizing and stray fields. The circular magnetization mode eliminates magnetic poles and the resulting demagnetizing and stray fields. However, implementations of ring-shaped elements have been limited to low impedance giant magnetoresistive (GMR) devices and require that a high current be passed vertically (perpendicular to the plane) through the element to generate circumferential magnetic field that writes the bit. Because of the direction of current, the ring-shaped elements are known as current perpendicular to the plane (CPP) ring-shaped devices.

SUMMARY OF THE INVENTION

The present invention provides an architecture for ring-shaped magnetoresistive elements configured for use as current-perpendicular-to-plane (CPP) devices. In accordance with a first aspect, a magnetoresistive memory cell is provided having a ring-shaped magnetoresistive multilayer element and at least one write line for switching a magnetization direction of a ferromagnetic layer of the element. According to an embodiment, the ring-shaped element is shaped like a hollow cylinder with a base, a top, a hole passing through the center, and a curved surface at the perimeter. Each write line is comprised of several segments that may include (i) a via; (ii) a top write line segment; (iii) and a base write line segment. The via is arranged within the hole of the ring-shaped element and passes from the base of the element to the top of the element. The top write line segment is arranged near the top of the element and is electrically coupled with the via. Likewise, the base write line segment is arranged near the base of the element and is coupled with the via. Both the top and base write line segments extend radially from the via toward the perimeter of the element and may be electrically isolated from the ring-shaped element itself.

In operation, a current passing through the write line creates a magnetic field that acts on the ring-shaped element in either a clockwise or counterclockwise direction about the center hole. The direction of the magnetic field depends upon the direction of current passing through the write line. The applied magnetic field is useful for switching the magnetization direction of one or more ferromagnetic layers of the element.

According to a further embodiment, a bit sense line is coupled with the top and base of the element and is used to create a voltage difference vertically across the element for determining (or reading) a logical (binary) state of the element. A current does not need to be passed through the bit sense line during a write sequence. This feature also allows the use of alternative embodiments of the ring-shaped element such as static read (SR) or dynamic read (DR).

In the static read embodiment, the ring-shaped element may further include an anti-ferromagnetic layer to pin the magnetization of one of the ferromagnetic layers—thus creating a stable (fixed) reference layer. Alternatively, the dynamic read embodiment does not include the antiferromagnetic layer or a fixed ferromagnetic layer. Rather, the dynamic read may use a freely switchable ferromagnetic layer (free layer) to determine the magnetic orientation of a storage ferromagnetic layer (storage layer).

In yet another aspect, a magnetoresistive memory device provides a plurality of ring-shaped multilayer magnetoresistive elements arranged in rows and columns, a plurality of row write-read lines, and a plurality of column write-read lines. Each row of elements is associated with a row write-read line. Likewise, each column of elements is associated with a column write-read line.

According to an embodiment, each row write-read line has a first half that begins on a first side of the row and passes to a second side of the row. A second half of the row write-read line begins on the second side of the row and passes back to the first side of the row. A loop interconnects the first half and second half at the second side of the row. Both the first half and second half of the row write-read line pass through a center hole of each element in the associated row. Thus, each element is configured with a row write-read line passing twice through its center hole. Column write-read lines may be arranged in a similar configuration with each column write-read line passing twice through the center hole of each associated element.

In a further embodiment, write-read lines pass from the top of one element to the top of a second element and (after passing through the center of the second element) from the base of the second element to the base of a third element. Thus, each write-read line has a repeating pattern that spans two elements. Because the two-element repeating pattern extends along both rows and columns, the device has a minimum write-read repeating pattern that spans a four-by-four array of elements. In an alternative embodiment, a minimum write-read repeating pattern of a single element is provided by passing a write-read line from the base of a first element to the top of a second element and (after passing through the center of the second element) from the base of the second element to the top of a third element.

These as well as other aspects and advantages of the embodiments will become apparent to those of ordinary skill in the art by reading the following detailed description with appropriate reference to the accompanying drawings.

BRIEF DESCRIPTION OF THE DRAWINGS

FIG. 3(a) provides a projection view of a static read ring-shaped memory element and a result of an anti-clockwise write magnetization field.

DETAILED DESCRIPTION

1. Overview

Figure 1:
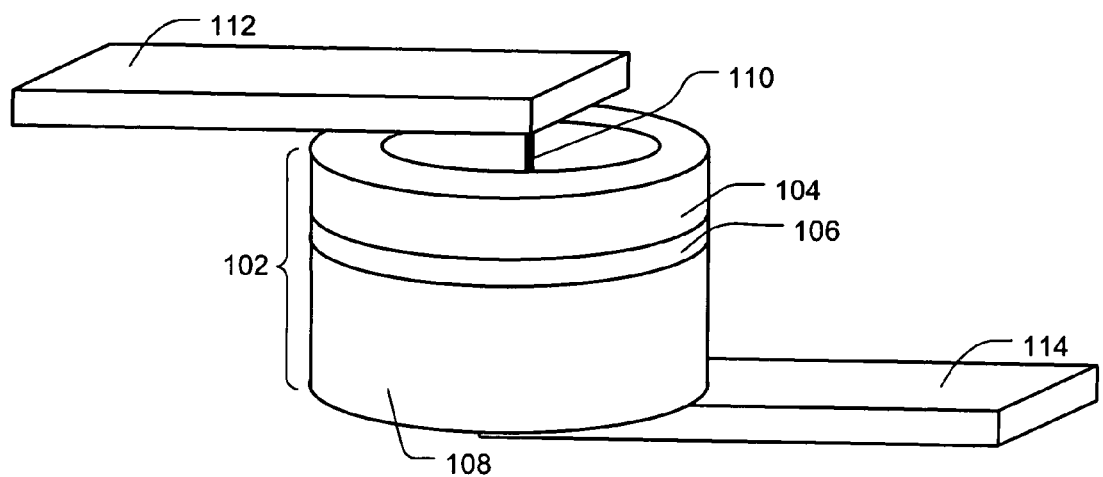
FIG. 1 provides a projection view of a simplified ring-shaped memory cell.

In an exemplary embodiment, a memory cell has a ring-shaped magnetoresistive element (or bit) configured with a write line threaded through a center hole in the ring-shaped element. FIG. 1 provides a perspective view of a simplified memory cell write structure. A ring-shaped multilayer magnetoresistive element 102 is shown having three ring layers stacked vertically. Two ferromagnetic ring layers, 104 and 108, sandwich a nonmagnetic spacer layer 106 (typically copper for GMR or alumina $Al_2O_3$ for magnetic tunnel junction (MTJ)). A via 110 is positioned within a center hole (or aperture) of the ring-shaped element 102 and extends vertically from the top of the element 102 to the base of the ring-shaped element 102. A top write line 112 is coupled with the top of the via 110. The top write line 112 extends radially from the center hole past the curved perimeter of the ring-shaped element 102. Likewise, a base write line 114 is coupled with the base of the via 110. The top write line 114 extends radially from the center hole past the curved perimeter of the ring-shaped element 102.

Each of the ferromagnetic ring layers, 104 and 108, has an associated magnetization direction. According to an embodiment, the magnetization directions of the ferromagnetic ring layers 104 and 108 are bi-stable, and are directed in either a clockwise or counterclockwise direction about the center hole of the ring-shaped element. Generally, the relative orientation of the ferromagnetic ring layers 104 and 108 alters a resistivity of a current passing perpendicularly through each layer of the ring-shaped element 102. Thus, the difference in resistance provides an indication of the magnetization direction of the ring layers.

The bi-stable magnetization directions follow what is known as the "easy-axis" of the element. The corresponding "hard-axis" refers to magnetization directions that are either radially-inward or radially-outward. According to a preferred embodiment, "hard axis" magnetization directions are not stable—although the magnetization direction of an element may temporarily point along the hard-axis during a switching process. Also, according to a preferred embodiment, the write lines are configured to exert the bulk of magnetic fields applied to the element in the easy-axis direction (and not in the hard-axis direction). However, it is recognized that the word lines shown or additional word lines may be configured to apply hard-axis fields to aid in state switching.

2. Dynamic Read Ring-Shaped Element

Figure 2A:
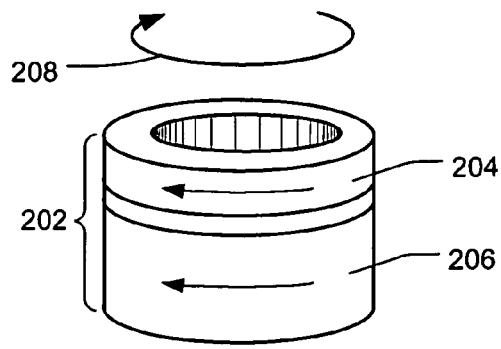
FIG. 2(a) provides a projection view of a dynamic read ring-shaped memory element and a result of a clockwise write magnetization field.
Figure 2B:
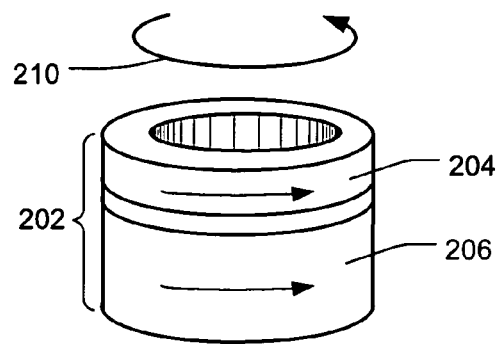
FIG. 2(b) provides a projection view of a dynamic read ring-shaped memory element and a result of an anti-clockwise write magnetization field.
Figure 2C:
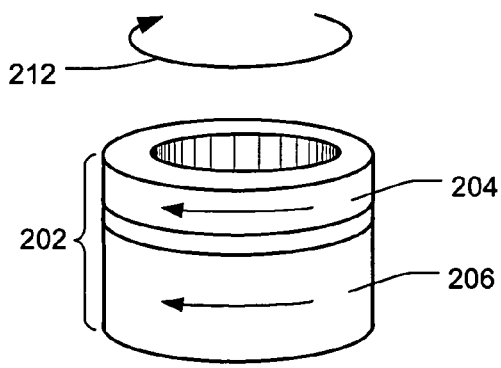
FIG. 2(c) provides a projection view of a dynamic read ring-shaped memory element and a result of a clockwise sense magnetization field.
Figure 2D:
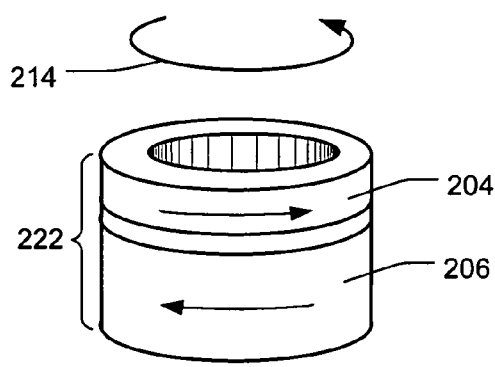
FIG. 2(d) provides a projection view of a dynamic read ring-shaped memory element and a result of an anti-clockwise sense magnetization field.

The relative orientations of the magnetization directions of a dynamic read (DR) element are shown in FIGS. 2(a)–2(d). Specifically, FIGS. 2(a) and 2(b) show an example of the change in magnetization directions of the ferromagnetic layers during a write sequence while FIGS. 2(c) and 2(d) show an example of the change in magnetization directions of the ferromagnetic layers during a dynamic read sequence.

FIG. 2(a) shows a tri-layer ring-shaped element 202 with two ferromagnetic layers, a sense layer 204 and a storage layer 206. Each of the two magnetic layers 204, 206 has an associated magnetization direction along an easy axis of the layer. The logical state of the element 202 is determined by the magnetization direction of the storage layer 206. The two ferromagnetic layers are separated by a spacer layer such as a tunnel junction. A clockwise write magnetic field 208 is indicated by a curved arrow and acts on the element 202.

In the element 202, the sense layer 204 is configured to switch its magnetization direction in response to the application of a magnetic field of at least a first threshold. Likewise, the storage layer 206 will switch its magnetization direction in response to the application of a magnetic field of at least a second threshold. The second threshold is generally higher than the first threshold. Thus in the embodiment shown in FIG. 2(a), the magnetization direction of the sense layer 204 is easier to switch than the magnetization direction of the storage layer 206. Because the storage layer 206 has a higher switching threshold than the sense layer 204, the storage layer 206 is said to have a higher coercivity than sense layer 204.

A sense magnetization arrow is shown at the sense layer 204 showing the magnetization direction of the sense layer 204 as a result of the clockwise write magnetic field 208. Likewise, a storage magnetization arrow is shown at the storage layer 206 showing the magnetization direction of the storage layer 206. As shown, both the sense layer 204 and storage layer 206 are switched to the clockwise direction in response to the clockwise write magnetic field 208. As such, the clockwise write magnetic field 208 has a strength of at least the second threshold. After being acted on by the clockwise write magnetic field 208, the magnetization directions of ferromagnetic layers 204 and 206 will generally have the same orientation or magnetization direction (to the left; or clockwise from a top-view). When the magnetization directions of the two ferromagnetic layers 204 and 206 have the same orientation, they are said to have parallel magnetization directions. Similarly, when the magnetization directions of the two ferromagnetic layers 204 and 206 have the opposite orientation, they are said to have anti-parallel magnetization directions. For instance, the two ferromagnetic layers 204 and 206 may be anti-parallel magnetization directions if the sense layer 204 has an anti-clockwise magnetization direction and the storage layer 206 has a clockwise magnetization direction.

In FIG. 2(b), the magnetization directions of the ferromagnetic layers 204 and 206 are switched to an anti-clockwise direction. This switch may be a result of the anti-clockwise write magnetic field 210 applied to the element 202. In order to switch both the sense layer 204 and the storage layer 206, the anti-clockwise write magnetic field has a strength of at least the second threshold. After being acted on by the anti-clockwise write magnetic field 210, the two ferromagnetic layers 204 and 206 will still have relative parallel magnetization directions, because the anti-clockwise write magnetic field 210 causes the magnetization directions of both ferromagnetic layers 204 and 206 to switch directions. Thus, the magnetization directions of ferromagnetic layers 204 and 206 of FIG. 2(b) are opposite to the direction to the corresponding magnetization directions of the ferromagnetic layers 204 and 206 of FIG. 2(a).

The logical state of the element 202 is dependent upon the magnetic direction of the storage layer 206. Because the write magnetic fields 208 and 210 are of sufficient strength (at least the second threshold), either are able to switch the magnetization direction of the storage layer 206 and thus switch the logical state of the element 202.

In order to determine the logical state of the element 202, a dynamic read sequence is used to autozero the sense layer 204 by applying a magnetization field to the element greater than the first threshold but less than the second threshold. FIGS. 2(c) and 2(d) show an example of the change in magnetization directions of the ferromagnetic layers 202 and 204 of the tri-layer ring-shaped element 202 during a dynamic read sequence.

In FIG. 2(c), a clockwise sense magnetization field 212 of at least the first threshold but less than the second threshold acts on the ring-shaped element 202. The clockwise sense magnetization field 212 is of sufficient strength to switch the magnetization direction of the sense layer 204, but is not of sufficient strength to switch the magnetization direction of the storage layer 206. Thus, the clockwise sense magnetization field 212 is configured to switch the magnetization direction of the sense layer 204 to a clockwise direction. If the magnetization direction of the sense layer 204 was in the clockwise direction prior to receiving the clockwise sense magnetization field 212, then the magnetization direction of the sense layer will remain unchanged.

After the magnetization direction of the sense layer 204 is secured in the clockwise direction, a current may be passed perpendicularly through the layers of the ring-shaped element 202 in order to determine a first resistance across the element 202. This first resistance will be compared with a second resistance obtained after switching the magnetization direction of the sense layer 204 to the anti-clockwise direction.

In FIG. 2(d), an anti-clockwise sense magnetization field 214 of at least the first threshold but less than the second threshold acts on the ring-shaped element 202. The anti-clockwise sense magnetization field 214 is of sufficient strength to switch the magnetization direction of the sense layer 204, but is not of sufficient strength to switch the magnetization direction of the storage layer 206. Thus, the anti-clockwise sense magnetization field 214 is configured to switch the magnetization direction of the sense layer 204 to an anti-clockwise direction. If the magnetization direction of the sense layer 204 was in the anti-clockwise direction prior to receiving the anti-clockwise sense magnetization field 214, then the magnetization direction of the sense layer will remain unchanged.

After the magnetization direction of the sense layer 204 is secured in the anti-clockwise direction, a current may be passed perpendicularly through the layers of the ring-shaped element 202 in order to determine a second resistance across the element 202. This second resistance will be compared with the first resistance obtained in order to determine the logical state of the ring-shaped element 202.

The relative orientation of the magnetization directions of the ferromagnetic layers 202 and 204 alters the resistance across the ring-shaped element 202 (top to bottom). Thus, when the magnetization directions are parallel (as shown by FIG. 2(c)), resistance to a current applied perpendicularly through the layers of the ring-shaped element 202 is at a minimum. Conversely, when the magnetization directions are anti-parallel (as shown by FIG. 2(d)), resistance across the ring shaped element 202 is at a maximum.

By determining that the first resistance is lower than the second resistance, a system controlling use of the ring-shaped element 202 may deduce that the magnetization direction of the storage layer 206 is in a clockwise direction.

3. Static Read Ring-Shaped Element

As opposed to the dynamic read ring-shaped element, in a static-read ring-shaped element, there is no need to autozero during a read sequence because the static-read ring-shaped element includes a reference layer with a known magnetization direction.

Figure 3A:
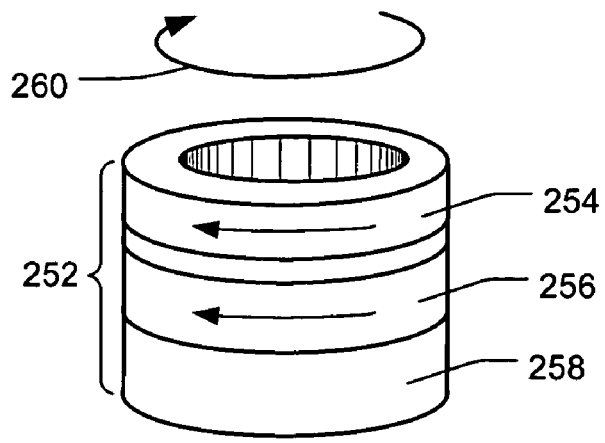
FIG. 3(a) provides a projection view of a static read ring-shaped memory element and a result of a clockwise write magnetization field.
Figure 3B:
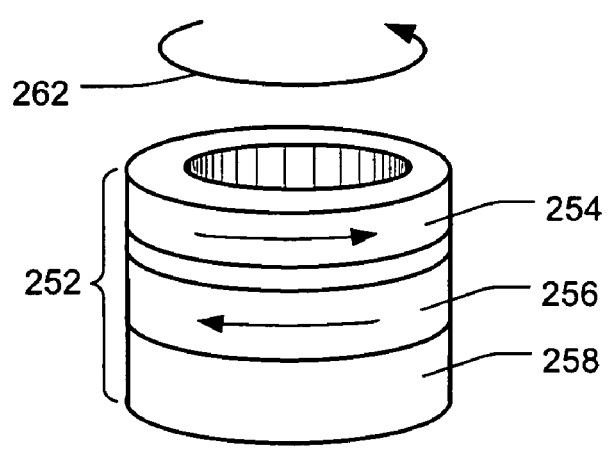

The relative orientations of the magnetization directions of a static read (SR) ring-shaped element are shown in FIGS. 3(a)–3(b). Specifically, FIGS. 3(a) and 3(b) show an example of the change in magnetization directions of the ferromagnetic layers during a write sequence. In the static-read ring-shaped element, there is no substantial change in the magnetization directions of the ferromagnetic layers during a read sequence.

FIG. 3(a) shows a static read ring-shaped element 252 with two ferromagnetic layers: a storage layer 254 and a reference layer 256. Each of the two magnetic layers 254 and 256 has an associated magnetization direction along an easy axis of the layer as shown by the arrow within each layer. The logical state of the static read element 202 is determined by the magnetization direction of the storage layer 254. The two ferromagnetic layers are separated by a spacer layer such as a tunnel junction. Generally the magnetization direction of the reference layer 256 is fixed (or "pinned") by an antiferromagnetic (AF) layer 258. Alternatively a synthetic antiferromagnetic (SAF) layer may be used for the pinned layer of the static read element 202. Platinum-mangenese (PtMn), FeMn (approx 10 nm thick), or ruthenium (Ru) may be used to produce the pinning effect on the reference layer 256 by creating an anti-parallel coupling between the antiferromagnetic layer 258 and the reference layer 256. One advantage of a SAF pinned layer for linear magnetized rectangular bits is that it has little or no net magnetic moment (i.e. stray field) because the magnetic field is substantially closed between the two anti-parallel coupled pinned layers. In the presently described circular magnetic bits, a SAF pinned layer may not exhibit any advantage over a standard AF pinned layer.

A clockwise write magnetic field 260 is indicated by a curved arrow and acts on the static write element 252. The storage layer 254 is configured to switch its magnetization direction in response to the application of a magnetic field of at least a third threshold. The magnitude of the third threshold depends upon the coercivity of the storage layer 254. Generally, a magnetic field of at least the third threshold will be sufficient to switch the magnetization direction of the storage layer 254. The reference layer 256 is configured to not switch its magnetization direction in response to any applied magnetic field within an operational range of the apparatus. The storage magnetization arrow is shown at the storage layer 254 as a result of the clockwise write magnetic field 260. Likewise, a storage magnetization arrow is shown at the reference layer 256 showing the magnetization direction of the reference layer 256. In this example, the magnetization direction of the reference layer 256 is clockwise. However, in an alternative embodiment, the reference layer 256 may be configured to have a "permanent" anti-clockwise magnetization direction.

In FIG. 3(b), the magnetization directions of the ferromagnetic layers 254 and 258 are acted on by an anti-clockwise magnetic field 262 of at least the third threshold. Thus, as a result, the reference layer 254 switches its magnetization direction to anti-clockwise.

The logical state of the static-read element 252 depends upon the magnetization direction of the storage layer 254. In order to determine the magnetization of the storage layer 254, a current is passed perpendicularly through the element 252 and a resistance (indirectly) measured. The relative orientation of the magnetization directions of the ferromagnetic layers alters the resistance across the element. Thus, when the magnetization directions are parallel (as shown by FIG. 3(a)), resistance to a current applied perpendicularly through the layers of the static read element 252 is at a minimum. Conversely, when the magnetization directions are anti-parallel (as shown by FIG. 3(b)), resistance across the static read element 222 is at a maximum.

The memory element 252 is useful for storing binary information. For instance, in an embodiment, when the magnetization directions of the storage and reference layers are parallel, resistance across the element is minimum—thus, reflecting a binary value of "0." Likewise, when the magnetization directions of the storage and reference layers are anti-parallel, resistance across the element is maximum—thus reflecting a binary value of "1." A person skilled in the art will recognize that the selection of "0" and "1" is arbitrary and could be reversed or otherwise altered without impairing functionality.

4. Applied Magnetic Fields

Figure 4:
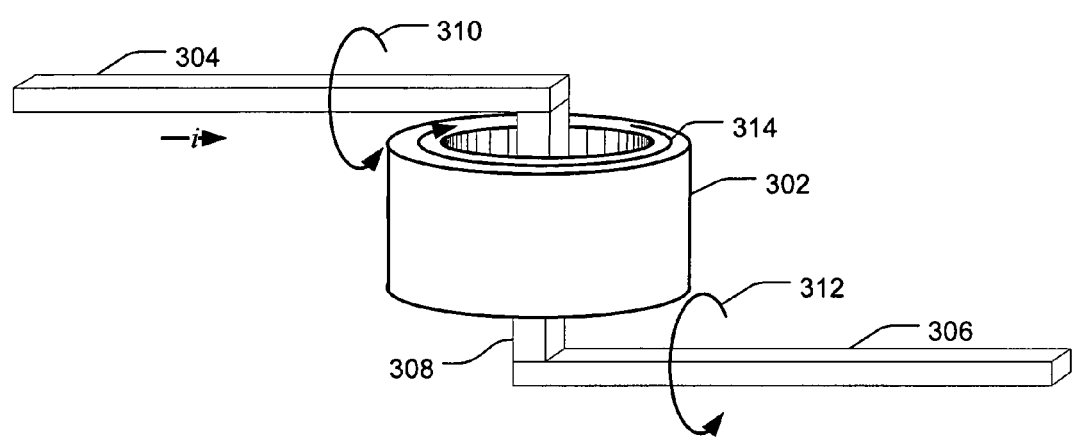
FIG. 4 provides a projection view of a simplified memory cell showing applied magnetic fields.

Exemplary magnetic fields created by a current i passing through a write line are shown in FIG. 4. A ring-shaped magnetoresistive element 302 is shown with a write line threaded through the center hole of the ring-shaped element 302. (For simplicity, the layers of the element have not been shown.) The write line is made up of three segments: a top write line 304 passing near the top of the ring-shaped element 302, a base write line 306 passing near the base of the ring-shaped element 302, and a via 308 passing through the center hole of the ring-shaped element 302. A current i is shown passing from left to right through the write line. Generally, a current passing through a wire (such as the write line) will create a magnetic field acting circumferentially to the flow of current according to the right-hand rule of electromagnetism.

Magnetic fields created by the current i are shown for each segment of the write line. A first magnetic field 310 is shown looping around the top write-read line 304. The first magnetic field 310 acts on the left side of the ring-shaped element 302 to promote a clockwise (as seen from the top) magnetization direction of the ferromagnetic layers of the ring-shaped element 302. A second magnetic field 312 is shown looping around the base word line 306. The second magnetic field 312 acts on the right side of the ring-shaped element 302 to promote a clockwise magnetization direction of the ferromagnetic layers of the ring-shaped element 302. A third magnetic field 314 is shown looping around the via 308. The third magnetic field acts on the ring-shaped element 302 to promote a clockwise magnetization direction of ferromagnetic layers of the ring-shaped element 302.

As one skilled in the art will readily recognize, if the direction of current i is reversed, the direction of each of the magnetic fields 310, 312, and 314 will also reverse. In addition, the strength of the magnetic fields 310, 312, and 314 increases as the magnitude of current i increases. Thus, a larger current i may be required to switch the magnetization direction of a ferromagnetic layer with a high coercivity than would be required to switch the magnetization direction of a ferromagnetic layer with a low coercivity. Generally, control circuitry connected with the word line will control the direction and magnitude of current i.

5. Ring-Shaped Magnetic Tunnel Junction

A spacer layer is provided to separate the two ferromagnetic layers in the ring-shaped element. In the exemplary embodiment, the spacer layer is a tunneling layer, and thus, the ring-shaped element is a a ring-shaped (RS) magnetic tunnel junction (MTJ) that makes use of the tunneling magnetoresistive effect to store binary information. MTJ's are favored because they can provide a high magnetoresistive ratio compared with other magnetic memory elements.

In an embodiment, the MTJ has a nonmagnetic tunnel junction layer sandwiched between two ferromagnetic layers. In a typical static-read arrangement, one of the magnetic layers is configured to be a fixed layer. An anti-ferromagnetic layer, such as platinum manganese (PtMn), may be useful in fixing the magnetization direction of the fixed layer. In practice the fixed layer may alternatively be designed with a high coercivity so that any operational magnetic field would not alter the magnetization direction of the fixed layer. Thus, the fixed layer is treated substantially like a permanent magnet with a permanent direction. A second magnetic layer is termed a storage layer. The storage layer is configured to switch its magnetization direction in response to an externally applied magnetic field of sufficient strength. As an example, in FIG. 1, the ring-shaped multilayer magnetoresistive element may be a MTJ if the nonmagnetic spacer layer 106 were a nonmagnetic tunnel junction layer.

In order to store binary data, the MTJ has two possible logical states (i.e. binary states). These states are often referred to as "1" and "0." The state of the MTJ is defined by whether the magnetization directions of the two magnetic layers are parallel or anti-parallel.

The tunneling magnetoresistive effect is based on the phenomenon that an applied magnetic field can influence the resistivity of a material. In simple terms, the resistance to a current passing through the MTJ is "high" when the magnetization directions of the magnetic layers are anti-parallel and "low" when the magnetization directions are parallel. Usually, the resistivity of an MTJ is determined by applying a read voltage and measuring a read current passed perpendicularly (vertically) through each layer of the MTJ.

According to an embodiment, the barrier layer is an aluminum oxide ($AlO_2$) ring-shaped layer that is grown to approximately 10 angstroms thick. Care should be taken to ensure that no holes exist in the barrier layer. Other embodiments of the barrier layer may also be used.

One measure for the quality of an MTJ is its magnetoresistive ratio defined as ($\Delta R/R_{min}$). $\Delta R$ is defined as the difference between the resistivity of the MTJ when the magnetization directions are anti-parallel and the resistivity of the MTJ when the magnetization directions are parallel, while $R_{min}$ is the resistivity of the MTJ when the magnetization directions are parallel (minimum resistivity). According to an embodiment, a magnetoresistive ratio of 40% or more can be achieved in a ring-shaped MTJ.

An alternative ring-shaped element, termed a dynamically switched ring-shaped magnetic tunnel junction (MTJ) element, is proposed that has the autozero write/read functionality similar to a pseudo spin-valve (PSV) giant magnetoresistive (GMR) element, but has a tunneling barrier separating the two ferromagnetic layers. Thus, a nonmagnetic tunnel junction layer is sandwiched between a ferromagnetic sense layer and a ferromagnetic storage layer. The two ferromagnetic layers are configured such that the storage layer has a higher coercivity than the sense layer. The magnetization direction of the storage layer is indicative of the logical state of the ring-shaped element. The magnetization direction of the sense layer is switched during a read sequence and used to interrogate the storage layer in order to determine the magnetization direction of the storage layer.

As one skilled in the art will understand, other layers, such as caps, etch stops, anti-ferromagnetic layers, conductors, etc., may be added to the stack of any of the described ring-shaped element types. Generally, the ring-shaped magnetoresistive element is considered to have a cylindrical shape with a hollow center hole. However, the shape is not restricted to strictly interpreted geometric cylindrical embodiments. For example, a toroidally shaped magnetoresistive element is also proposed.

In another embodiment, the outside diameter of the ring shaped element is approximately 0.5 micrometers. (Other sizes may be also used). Although not critical, care should be taken to ensure that each ring-shaped element in a memory device is approximately the same size and shape. This uniformity aids in reliability and simplicity of associated write/read functionality.

In yet another embodiment, the ring-shaped element includes a plurality of ferromagnetic ring layers that are separated by nonmagnetic spacer layers. Each ferromagnetic ring layer has a bi-stable magnetic configuration. In other words, a magnetization direction within each ferromagnetic layer is stable in both (but only one at a time) a clockwise direction around the center hole of the element and an anti-clockwise direction around the hole. Resistance across the element is at a minimum when the magnetization directions of the ferromagnetic layers are in a parallel orientation, and resistance is at a maximum when the magnetization directions of the ferromagnetic layers are anti-parallel.

6. Exemplary Memory Cell

According to an embodiment, a memory array is made up of a plurality of rows and columns. At the intersection of each row and column lies a memory cell. The memory cell is configured to handle a bit of data (1 or 0) and may contain one or more ring-shaped memory elements along with read/write circuitry (e.g. a read select transistor).

Figure 5:
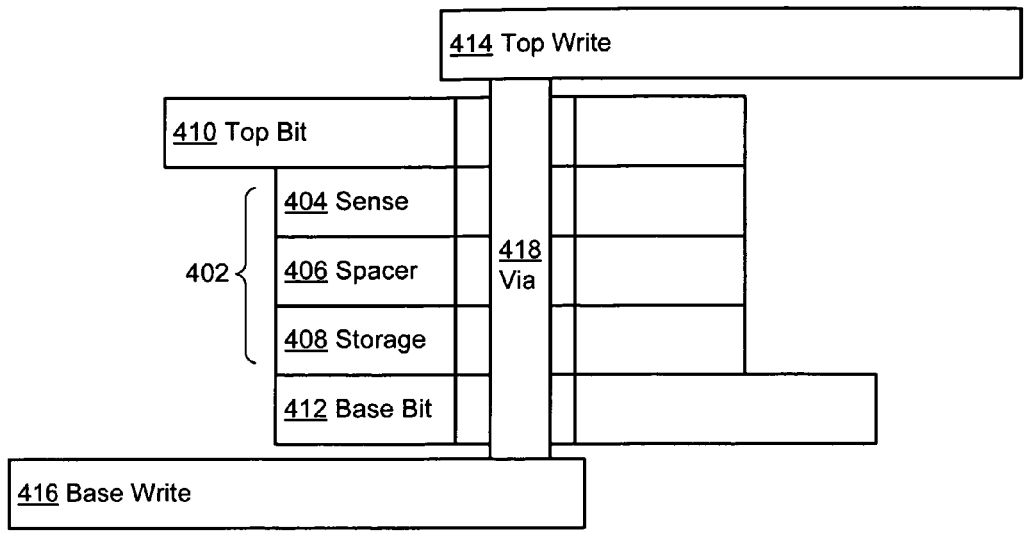
FIG. 5 is a cross-sectional view of a memory cell showing write-read connections.

FIG. 5 provides a cross-sectional view of a portion of a memory cell having a single ring-shaped element. A ring-shaped magnetoresistive memory element 402 is shown as a tri-layer device having a sense layer 404, a spacer layer 406, and a storage layer 408. The sense layer 404 and storage layer 408 are both magnetic (ferromagnetic) layers each having a magnetization direction. The spacer layer is a nonmagnetic spacer. Coupled with the sense layer 404 is a top bit sense line 410. Likewise, a base bit sense line 412 is coupled with the storage layer 408. The two bit sense lines 410, 412 are used to create a voltage difference across the ring-shaped element 402 for determining a top-bottom resistance across the element 402. The resistance, in turn, is indicative of the logical state (0 or 1) of the memory cell.

A top write line 414 is configured near the top bit sense line 410 and is electrically isolated from the ring-shaped element 402 and from the top bit sense line 410. A base write line 416 is configured near the base bit sense line 412 and is electrically isolated from the ring shaped element 402 and from the base bit sense line 412. A via 418 passes through a center hole in the ring-shaped element 402 and electrically interconnects the top write line 414 with the base write line 416. The via 418 is also electrically isolated from the ring-shaped element 402 and from the top and base bit sense lines 410, 412. An inner wall of the layers is used to indicate isolation between the via 418 and ring-shaped element 402 and the top and base bit sense lines 410, 412.

Additional control circuitry (not shown) is used to control current flow and voltage in the write-read lines and bit sense lines. In the bit sense lines, for example, a voltage difference may be created across the layers of the ring-shaped element 402 by coupling the top bit sense line 410 with a power source and coupling the base bit sense line 412 with a ground. The voltage difference may be triggered by, for example, a switch, such as a transistor, interconnected between the base bit sense line 412 and the ground. The voltage difference is applied in order to determine whether the resistance across the ring-shaped element 402 is "high" or "low." This binary state of the resistance is indicative of data stored in the ring-shaped element. (Although in the case of a pseudo spin-valve, two readings may be required to determine the value of the data—one before and one after switching the magnetization direction of the sense layer.) As one skilled in the art will understand, an assortment of control and latching schemes are available for obtaining an indication of the resistance across the ring-shaped element 402. According to certain terminology, a bit sense line comprises the pathway from the top bit sense line 410 through the ring-shaped element 402 to the base bit sense line 412.

The write lines 414, 416 are arranged near the ring-shaped element 402 such that a current passing through the write lines 414, 416 generates magnetic fields that act on the ring-shaped element 402 for switching the magnetization direction of at least one of the magnetic layers 404, 408. In one embodiment, current passing through the via 418 also creates a magnetic field for switching the magnetization direction of at least one of the magnetic layers 404, 408. According to another embodiment, the magnetic fields created at the via 418 are negligible. In a further embodiment, a current is passed across the ring-shaped element 402 from the top bit sense line 410 to the base bit sense line 412 for switching the magnetization direction of at least one of the magnetic layers 404, 408.

In an alternative embodiment, ring-shaped magnetoresistive memory element 402 is a tri-layer device having a storage layer 404, a tunnel layer 406, and a reference layer 408. The storage layer 404 and reference layer 408 are both magnetic (ferromagnetic) layers each having a magnetization direction. The spacer layer is a nonmagnetic tunnel. Coupled with the storage layer 404 is a top bit sense line 410. Likewise, a base bit sense line 412 is coupled with the reference layer 408. The two bit sense lines 410, 412 are configured to create a voltage difference across the ring-shaped element 402 for determining a top-bottom resistance across the element 402.

Figure 6:
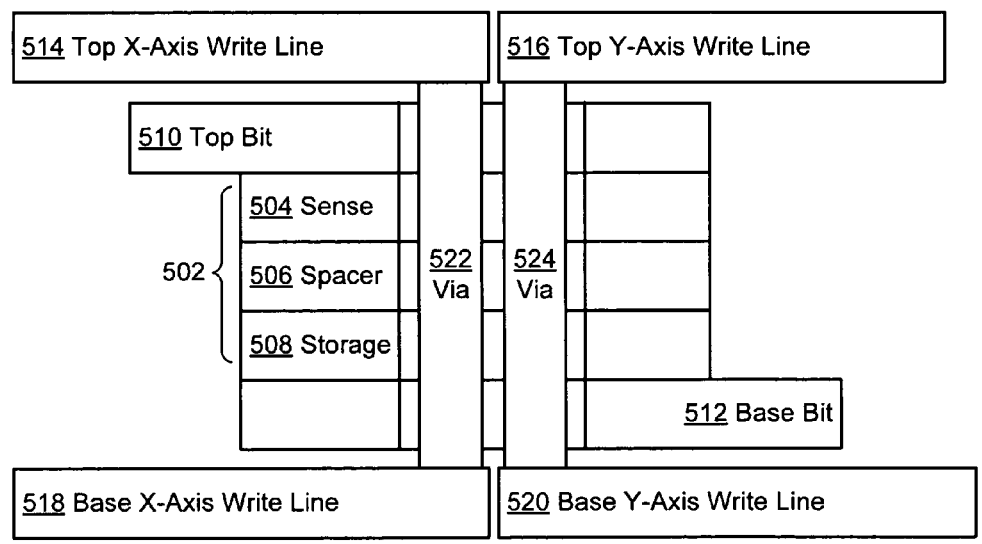
FIG. 6 is a second cross-sectional view of a simplified memory cell showing write-read connections.

FIGS. 5 and 6 provide embodiments as an illustration of a configuration of a memory cell and should be seen as instructive rather than limiting. For example, it will be understood that the layer 404 and layer 408 may be switched with one another or replaced with storage and reference layers. Additionally, the top bit sense line 410 is interchangeable with the base bit sense line 412. Generally, the base is understood to be closer to the substrate or circuit board foundation than the top. However, one skilled in the art will understand that the order of the stack can be inverted without substantial problems.

FIG. 6 is a cross-sectional view of a memory cell having multiple word lines threaded through a ring-shaped element. A ring-shaped element 502 is shown as a tri-layer device having a nonmagnetic spacer layer 506 sandwiched between a ferromagnetic sense layer 504 and a ferromagnetic storage layer 508. Other types of ring-shaped elements may also be used—such as those with more than two ferromagnetic layers. A bit sense line passes from a top bit sense line 510 through the ring-shaped element 502 to the base bit sense line 512.

A pair of write lines α-axis write line and y-axis write line) is shown threaded through the center hole of the ring-shaped element 502. A top x-axis write line 514 is arranged near the top bit sense line 510 and coupled with a first via 522 that passes through the center hole. The first via 522 is also coupled with a base x-axis write line 518 arranged near the base bit sense line 512. A top y-axis write line 516 is arranged near the top bit sense line 510 and coupled with a second via 524 that passes through the center hole. The second via 524 is also coupled with a base y-axis write line 520 arranged near the base bit sense line 512. The write lines are arranged to extend radially from their via coupling points past the perimeter of the ring-shaped element. According to a preferred embodiment, the write-read lines are made of aluminum, although other conductors are applicable, such as nickel iron (NiFe), clad gold and copper, for instance. One skilled in the art will recognize that various materials are available for construction of the write-read lines and other features of the embodiments. According to an embodiment, each write-read line is electrically isolated from the ring-shaped element 502 and from top and base bit sense lines 510, 512 by, for example, a silicon dioxide (SiO$_2$) coating or layer. In addition, each write-read line may be electrically isolated from the other write-read lines (at least in the region of the memory cell).

In operation, a current is passed through both the x-axis and y-axis write-read lines to create a combined magnetic field that acts to switch the magnetization direction of at least one of the ferromagnetic layers of the ring-shaped element. According to one dynamic read embodiment, a switching sequence of the sense layer involves passing a current through only the x-axis write-read line, and a switching sequence of the storage layer involves passing a current through both the x-axis and y-axis write-read lines. As can be understood from the diagram, the x-axis and y-axis word lines can be interchanged without altering functionality of the memory cell.

Figure 7:
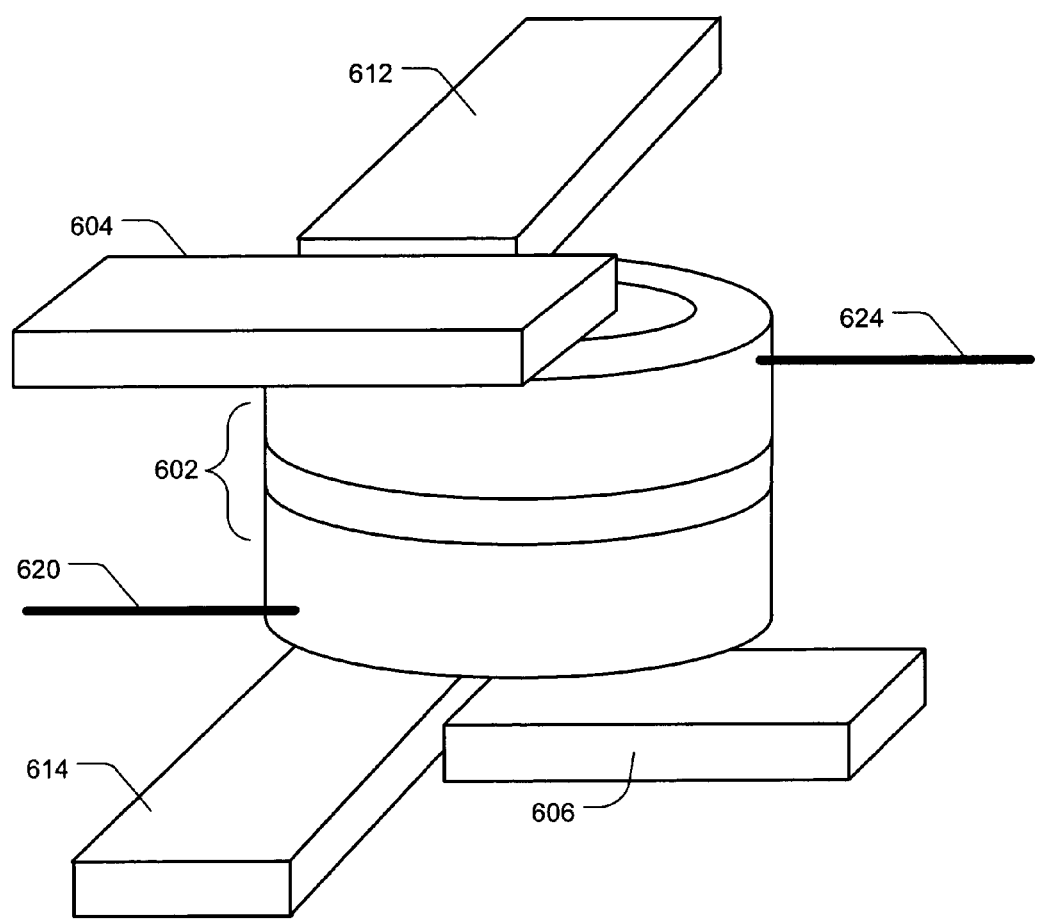
FIG. 7 provides a projection view of a simplified memory cell showing a memory element and multiple write/sense lines (vias not shown).

FIG. 7 illustrates a simplified memory cell having multiple write-read lines for applying magnetic fields to a ring-shaped memory element 602. The x-top write line 604 passes radially over a quadrant of the ring-shaped element 602 and is connected with x-base write line 606 through a first via (not shown) that passes through a center hole in the ring-shaped memory element 602. The x-base word line 606 passes radially under a quadrant of the ring-shaped element 602. A y-top write-read line 612 is connected with y-base write line 614 through a third via (not shown) that passes through the center hole. Each write line 604, 606, 612, & 614, passes radially near a quadrant of the ring shaped element 602 and is configured to generate a magnetic field for switching at least one magnetic layer of the ring-shaped element 602.

A base bit 620 is coupled with the ring-shaped element 602 at a point below the tunneling layer of the element. A top bit 624 is coupled with the ring-shaped element 602 at a point above the tunneling layer. During a read sequence, the bits 620 and 624 are used to create a voltage difference across the tunneling layer in order to determine a resistivity of the tunneling layer. The resistivity is useful as an indication of the logical state of the ring-shaped element 602.

7. Exemplary Construction

Again looking at FIG. 5, the steps of manufacturing of an embodiment of a magnetoresistive memory cell tunneling are described below. Beginning with a seed layer (not shown) such as Ta, a base write-read line 416 is deposited on the substrate and patterned. After an insulating layer is deposited on the base write-read line 416, a ring-shaped base bit sense line 412 is deposited and patterned for connecting a ground (not shown) with a ring-shaped storage layer 408. The ring-shaped storage layer 408 is deposited and patterned on the base bit sense line 412, and a spacer layer 406 is grown upon the storage layer 408 and patterned. A sense layer 404 is deposited and patterned above the spacer layer 406. A top bit sense line 410 is deposited on the sense layer 404 and patterned. After an insulating layer is deposited on the top bit sense line 410 and patterned, a top write-read line 414 is deposited and patterned. A via 418 passes through the center hole of the layers and interconnects the two write-read lines 414, 416.

According to the preferred embodiment, all depositions are made across an entire silicon wafer and patterning is by a mask and etch process. Further, or alternatively, a cap layer (not shown), such as of Ta, may also be provided as well as an etch stop such as CrSi or TiN.

A magnetic layer of the element may be designed as a single layer, a bilayer, or a multilayer. A single layer, for example, may be constructed of nickel-iron (NiFe) or nickel-iron-cobalt (NiFeCo). Alternatively, a bilayer, such as NiFe/CoFe may be used. More generally, a multilayer of various ferrous alloys may be used (a bilayer is a form of multilayer). The device may be grown by sputtering, ion beam deposition, plasma vapor deposition, evaporation, or epitaxy, for example. Patterning can be by wet chemical etching, dry etching, ion milling, or reactive etching, for example. These steps of manufacturing a cell are meant to provide a general illustration of a single process for an embodiment. One skilled in the art will recognize that many other manufacturing processes may be used to produce a memory cell or a memory array. Thus, these manufacturing steps should not be applied to limit the scope of the invention as claimed.

A standard antiferromagnetic (AF) or synthetic antiferromagnetic (SAF) layer can be used for the pinned layer of SV, GMR, or MTJ bits. According to an embodiment, a standard pinned layer is comprised of a magnetic layer, such as NiFe, adjacent to an antiferromagnetic (AF) layer, such as platinum-mangenese (PtMn). Similarly, a SAF pinned layer has a pair of magnetic layers separated by a material that promotes strong anti-parallel coupling between magnetic layers, such as ruthenium (Ru). One advantage of a SAF pinned layer for linear magnetized rectangular bits is that it has little or no net magnetic moment (i.e. stray field) because the magnetic field is substantially closed between the two anti-parallel coupled pinned layers. In the presently described circular magnetic bits, a SAF pinned layer may not provide any advantage over a standard AF pinned layer. Thus, providing a degree of freedom in manufacturing material selection.

8. Exemplary Memory Array

According to an embodiment, a memory device comprises multiple memory cells arranged within a memory array. The memory array is preferably arranged in a plurality of rows and columns with a memory cell aligned at the intersection of each row and column. According to an embodiment, rows and columns are said to run along an x-axis and y-axis respectively. Write lines are also provided that span the rows and columns and thread through the center hole of ring-shaped magnetoresistive memory elements of the memory cells.

Figure 8:
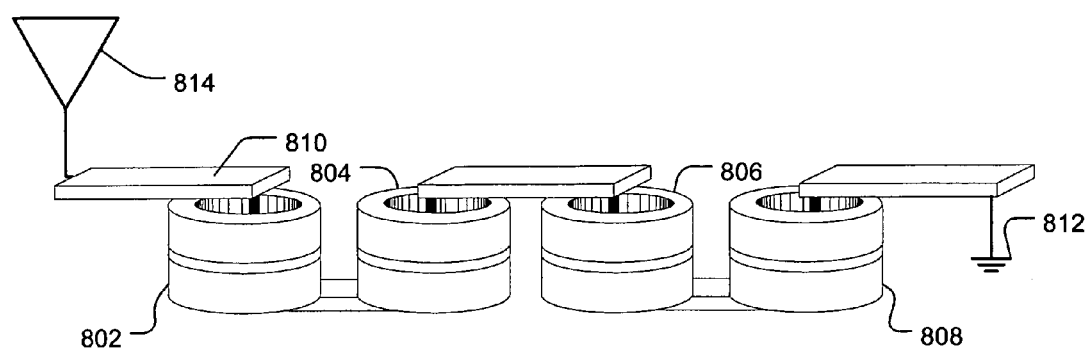
FIG. 8 shows an embodiment of a row of a simplified memory array.

FIG. 8 provides a simplified view of a portion of a row (or column) showing a single write-read line 810 threaded through the center hole of each ring-shaped element 802, 804, 806, 808 in the row. Although the write-read line 810 is aligned near the ring-shaped elements 802, 804, 806, 808, it is electrically isolated from the elements 802, 804, 806, 808 and their sense lines (not shown).

Examining the write line 810 from left to right: the write-read line 810 begins above a first ring-shaped element 802 and passes radially inward toward a center hole of the first ring-shaped element 802. The write line 810 then passes through the center hole of the first ring-shaped element 802 to the bottom of the first ring-shaped element 802. From the bottom of the center hole of the first ring-shaped element 802, the write line 810 passes to a bottom of a center hole of a second ring-shaped element 804 and through the center hole to a top of the second ring-shaped element 804. As shown, the write line 810 continues to thread through the remaining third and fourth ring-shaped elements 806, 808, passing top-to-top and bottom-to-bottom.

The top-to-top and bottom-to-bottom pattern exhibited by the write-read line results in a 2× minimum repeating pattern (i.e., the connection pattern repeats at every other memory cell in the row).

A current source 814 for delivering a current is coupled with the write line 810 half write-read line 1008. The end of the write line 810 is coupled with a ground 812. A switching mechanism, such as a transistor, may be used to initiate current flow through the write line 810.

According to an embodiment, the current source 814 is configured to generate current in both positive and negative directions and with at least two magnitudes in order to operate read/write functionality of a dynamically switched array of memory elements. Other elements, such as switches, resistors, etc. have been left out of the drawing for simplicity. One skilled in the art will understand that such devices can be added to the circuit for better control and reliability, for example. Write-read lines associated with columns are not shown in FIG. 8. According to an embodiment, the addition of row write-read lines and column write-read lines would result in at least two lines threaded through each ring-shaped element.

An aspect of some embodiments is that x-axis and y-axis write-read lines are shaped and arranged to provide substantially uniform radial currents and circumferential magnetic fields around each ring-shaped element in both half-select and full-select write/read modes of operation. This uniformity is useful for reliable write/read performance.

9. Exemplary Memory Array

Figure 9:
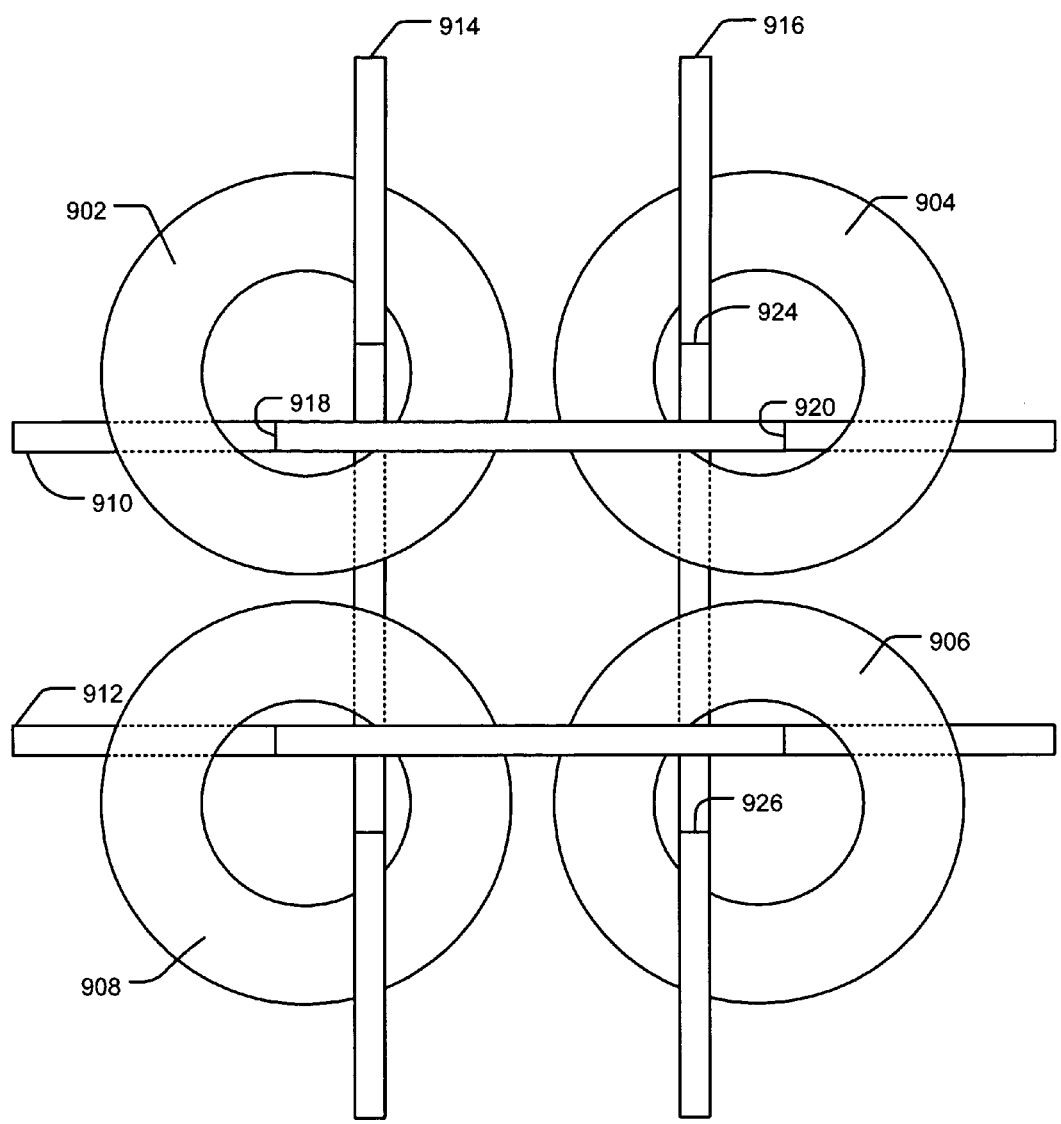
FIG. 9 shows a top view of a segment of a simplified memory array.

FIG. 9 is a block diagram showing a 2×2 memory array and without associated circuitry. Four ring-shaped elements 902, 904, 906, 908 are shown as circles in the figure and are arranged in a plurality of rows and columns.

Two row write lines 910 and 912 are shown weaving through each ring shaped element in their respective row. The row write lines pass through a center hole of each associated ring-shaped element. Both the row write lines follow the same pattern running left to right. As an example, look at a first row write line 910 running left to write. At the far left of FIG. 9, the first row write line 910 runs under a left edge of a first ring-shaped element 902 (dashed line indicates passing under). At a first junction 918, the first row write line 910 passes from the bottom to the top of the first ring-shaped element 902 along a via. Continuing left to right, the first row write line 910 now passes over a first column write line 914 and over a right edge of the first ring-shaped element 902. The first row write line 910 is then shown passing over the left edge of a second ring-shaped element 204 and over a second column write line 916. At a second junction 920, the first row write line 910 passes from the top to the bottom of the first ring-shaped element 902. Continuing left to right, the first row write line 910 passes under a right edge of the second ring shaped element 904. As shown, a second row write line 912 follows a similar pattern.

Two column write lines 914 and 916 are shown weaving through each ring shaped element in their respective columns. The column write lines 914 and 916 pass through the center hole of each associated ring-shaped element. As an example, look at the second column write line 916 running top to bottom. At the top of FIG. 9, the second column write line 916 runs over a top edge of the second ring-shaped element 904. At a third junction 924, the second column write line 916 passes from the top to the bottom of the second ring-shaped element 904 along a via. Continuing from top to bottom, the second column write line 916 now passes under the first row write line 910 and under a bottom edge of the second ring-shaped element 904. Upon reaching a third ring-shaped element 906, the second column write line 916 passes under a top edge of the third ring-shaped element 906 and under the second row write line 912. At a fourth junction 926, the second column write line passes from the bottom to the top of the third ring-shaped element 906 and subsequently over the bottom edge of the third ring-shaped element.

Further, row control circuitry and column control circuitry (not shown) contain switches and power sources for delivering write current to the write lines. These control circuitry may be situated at ends of rows and columns, for instance. Further circuitry may be included within each memory cell.

In an exemplary write operation of the second ring-shaped element 904, currents are passed through both the first row write line 902 and the second column write line 916 for generating magnetic fields that act on the ring-shaped elements in the respective first row and second column. The row current and column current each create uniform half-select magnetic fields that are individually insufficient to switch the magnetization direction of a storage magnetic layer of the ring-shaped elements. Because both the first row write line 910 and the second column write-read line 916 act on the second ring-shaped element 904, a combined magnetic field is created that is sufficient to invert the magnetization direction of a storage layer of that element (or other layer depending upon the type of ring-shaped element).

Application of the row current and column current should be coordinated so that they generate additive magnetic fields rather than fields that cancel one another. Additionally, according to a preferred embodiment, currents may be applied simultaneously or with a minimal delay.

In a further embodiment, during a read sequence of, for example, a dynamic read device, the magnetization direction of the sense layer of the pseudo spin-valve has a lower coercivity than the storage layer, and thus may be inverted by application of a current through either a row write line or through a column write line. Thus, the storage layer is configured to invert its magnetization direction in response to a magnetic field of at least a first threshold strength applied on the element, and the sense layer is configured to invert its magnetization direction in response to a magnetic field of at least a second threshold strength applied on the element. Since the coercivity of the storage layer is greater than the sense layer, the first threshold strength is greater than the second threshold strength.

In a further/alternative embodiment, bit lines are coupled with the control circuitry and coupled with the ring-shaped elements for sensing a quantity indicative of a logical state of the elements. Additionally, the bit sense lines may also be configured to supply additional switching current for generating magnetic fields for switching magnetic layers of the various types of ring-shaped elements.

According to one embodiment, each ring-shaped element is used to store a bit of data without redundancy. For example, a single ring-shaped magnetic tunnel junction element with a minimum resistance of 20K Ohms and a magnetoresistive ratio of 40% may be used as a "solo" element. In an alternative embodiment, several ring-shaped elements are combined to obtain a useable read signal. For example, it may take several ring-shaped elements with a minimum resistance of 50 Ohms and a magnetoresistive ratio of only 5% to obtain a useable read signal. Thus, in a similar embodiment, a redundancy scheme is provided wherein a plurality of elements are used to store a single bit of data. In that embodiment, the bit sense line, may, for example pass through the plurality of elements in series.

10. 2R5T Memory Cell Architecture

Figure 10:
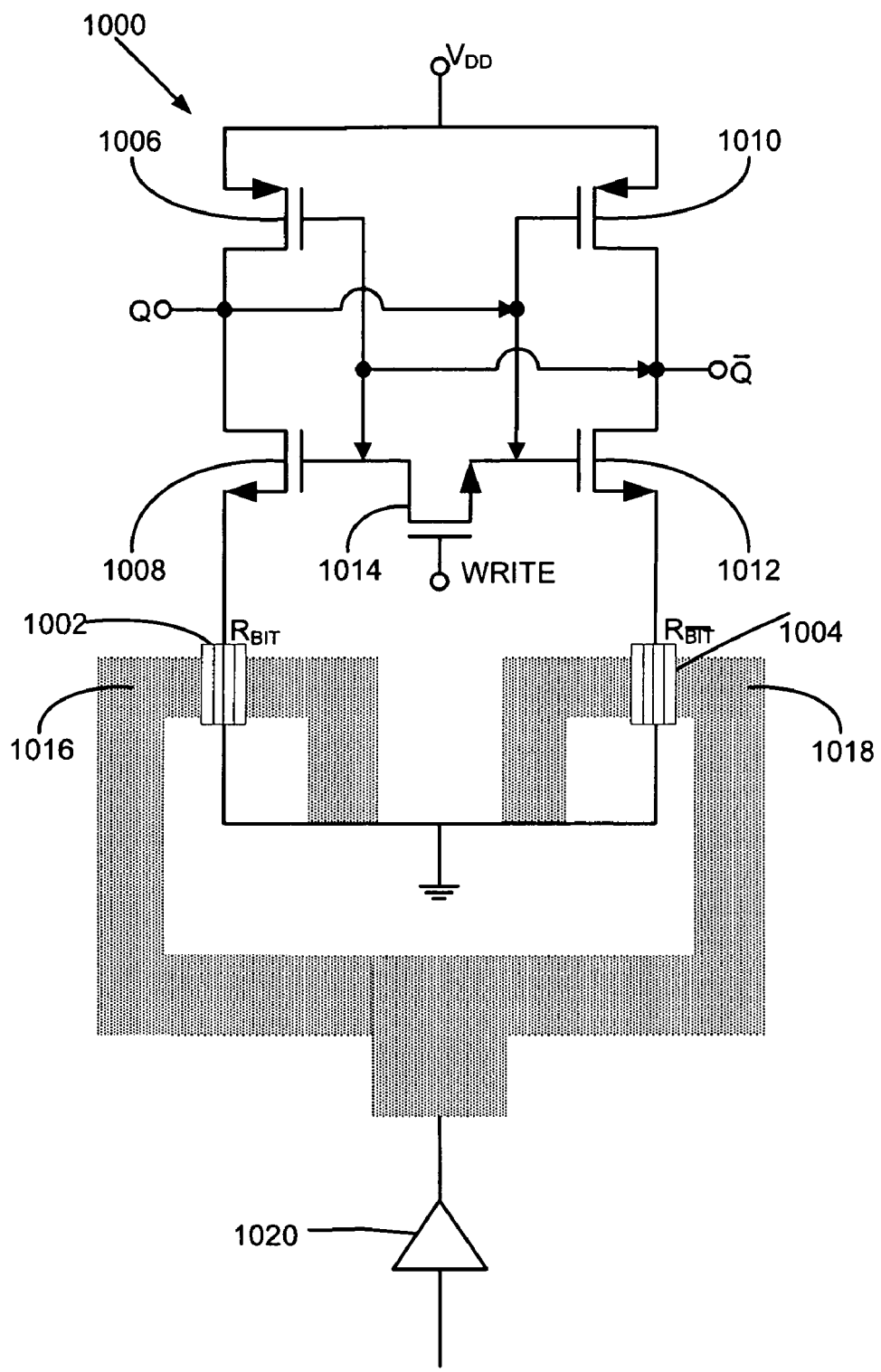
FIG. 10 is a schematic diagram of a "2R5T" memory cell employing a ring-shaped memory element.

One application of an embodiment is in magnetic random access memory (MRAM) memory elements. FIG. 10 is a schematic diagram showing an exemplary MRAM memory element 1000, in which an embodiment can be employed. Memory element 1000 includes ring-shaped magnetoresistive elements 1002 and 1004, which may, for example, be static read ring-shaped elements or dynamic read ring-shaped elements. Memory element 1000 also includes transistors 1006, 1008, 1010, and 1012 connected together in a latching configuration. In addition, a reset or write transistor 1014 is connected between the gate terminals of transistors 1008 and 1012. Because of the presence of two resistors and five transistors, this memory element configuration may be referred to as a "2R5T" architecture.

In this configuration, transistors 1006 and 1008 function as a first inverter, which is connected to a power supply terminal, $V_{DD}$, and connected to ground via magnetoresistive element 1002. Transistors 1010 and 1012 function as a second inverter, which is connected to a power supply terminal, $V_{DD}$, and connected to ground via magnetoresistive element 1004. The first and second inverters are connected together in a cross-coupled configuration. In addition, transistor 1014 is arranged so that, when transistor 1014 is turned on, it substantially equalizes the voltages at the inputs of the first and second inverters.

Memory element 1000 also includes word lines 1016 and 1018 arranged near magnetoresistive elements 1002 and 1004, respectively. Word lines 1016 and 1018 are arranged such that currents flowing to ground apply magnetic fields to magnetoresistive elements 1002 and 1004 in opposite directions. In this way, write currents of the same magnitude flowing through word lines 1016 and 1018 program ring-shaped elements 1002 and 1004 into opposite logical states. Because word lines 1016 and 1018 are coupled, they may also be termed a single word line. A write driver 1022 is provided for delivering a write current to word lines 1016 and 1018. The write current is applied to switch the logical state of magnetoresistive elements 1002 and 1004.

To use memory element 1000, magnetoresistive elements 1002 and 1004 are first programmed into the desired logical states by a write current through word lines 1016 and 1018. Then, when the first and second inverters are either powered up by $V_{DD}$ or reset by turning on transistor 1014, the first and second inverters assume a latched state that corresponds to the logical states of magnetoresistive elements 1002 and 1004. The latched state of memory element 1000 may be sensed at the "Q" terminals.

11. 2R2T Memory Cell Architecture

Figure 11:
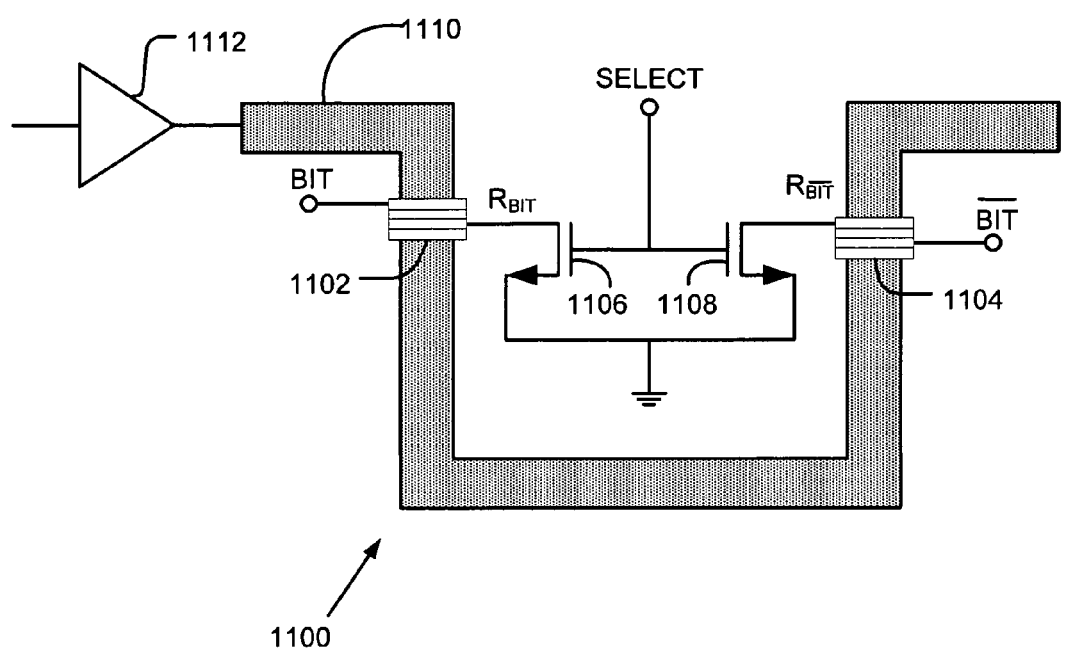
FIG. 11 is a schematic diagram of a "2R2T" memory cell employing a ring-shaped memory element.

FIG. 11 shows another exemplary MRAM memory cell 1100 in which two ring-shaped memory elements are used to store a bit of information. Memory cell 1100 includes ring-shaped magnetoresistive elements 1102 and 1104, which may, for example, be dynamic read or static read elements. Ring-shaped elements 1102 and 1104 are connected to ground via transistors 1106 and 1108, respectively. The gate terminals of transistors 1106 and 1108 are connected to a "SELECT" line that may be used to turn these transistors on and, thereby, sense the resistance of magnetoresistive elements 1102 and 1104. Because of the presence of two resistors and two transistors, this memory element configuration may be referred to as a "2R2T" architecture.

A write line 1110 is arranged near magnetoresistive elements 1102 and 1104 so that a current flowing through word line 1110 applies magnetic fields to magnetoresistive elements 1102 and 1104 in opposite directions. In this way, the same write current may be used to program magnetoresistive elements 1102 and 1104 into opposite logical states. A write driver 1112 is coupled with write line 1110 and provides a write current for switching the logical state of ring-shaped elements 1102 and 1104.

Once magnetoresistive elements are programmed in this way, memory element 1100 may be selected by a "SELECT" voltage that turns on transistors 1106 and 1108. The resistances of magnetoresistive elements 1102 and 1104, and, thus, the logical state of memory element 1100, may then be sensed through the "BIT" lines. In practice, the "BIT" lines may be connected to a latch to provide a latched output.

12. 1R1T Memory Cell Architecture

Figure 12:
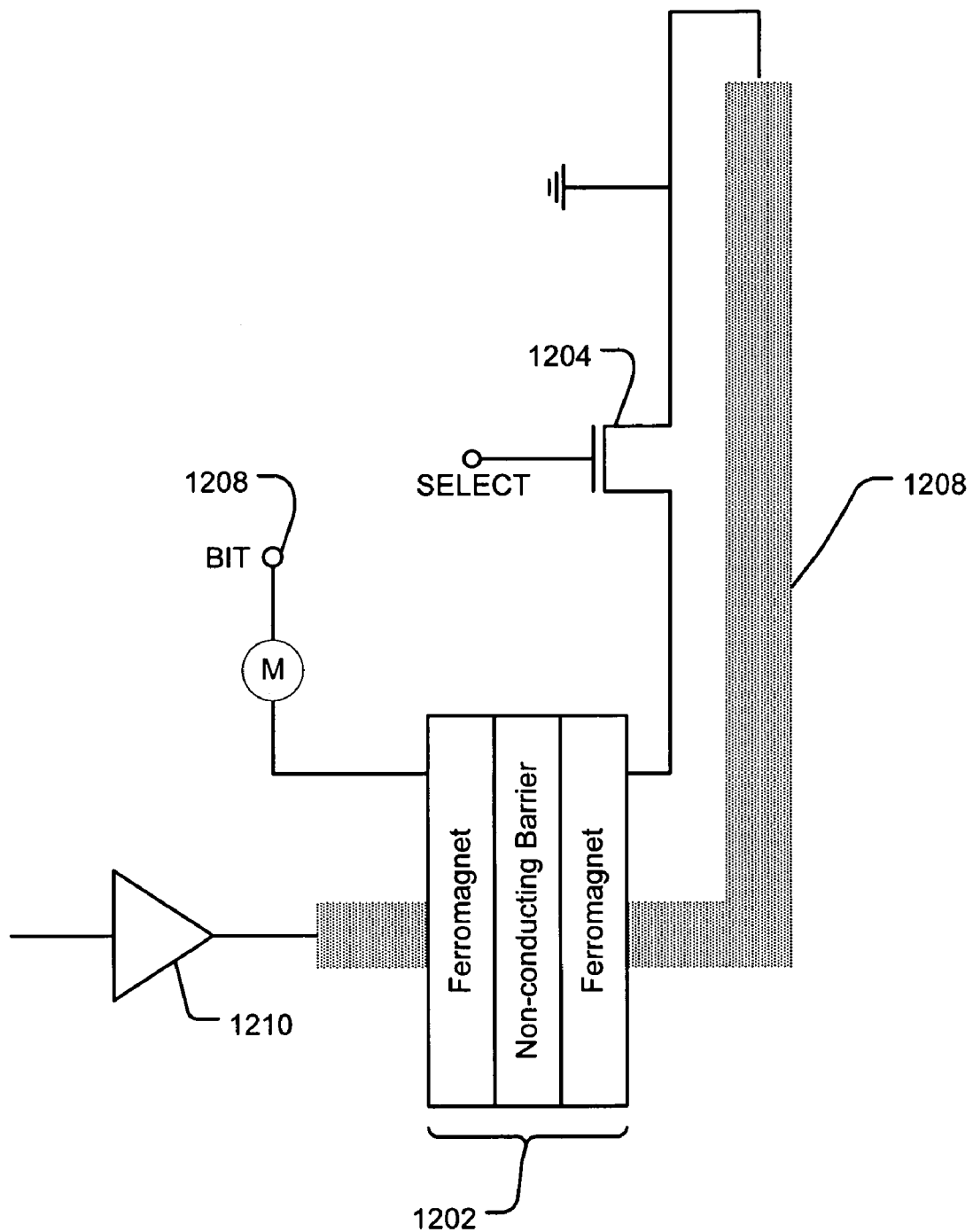
FIG. 12 is a schematic diagram of a magnetic tunnel junction cell employing a ring-shaped memory element.

FIG. 12 shows an exemplary MRAM element using a ring-shaped magnetic tunnel junction (MTJ) 1202 arranged as a current perpendicular to plane (CPP) device. The MTJ 1202 is a magnetoresistive element having a thin barrier layer sandwiched between two conducting magnetic layers. The MTJ 1202 is connected to ground via a transistor 1204. The gate terminal of transistor 1204 is connected to a "SELECT" line that may be used to turn this transistor on and, thereby sense the resistance of magnetoresistive elements 1202 when a read current is passed through the "BIT" line 1212. A write line 1206 is arranged near the RS MTJ 1202 such that a current in the word line 1206 will apply a magnetic field on the MTJ 1202. For instance, the write line 1206 may pass through the hole in the center of the RS MJT 1202. A write driver 1210 is connected to the write line 1208. The write driver 1210 provides a write current to the write line 1206. The write current is configured to be applied with sufficient magnitude to switch the logical state of the MTJ 1202. A current or other meter (M) is coupled with the bit line and is used to determine a resistivity of the CPP RS MJT 1202.

According to a further embodiment, a transistor 1204 or switch may serve an entire row (or column) of ring-shaped elements within an array, thus reducing the complexity of an individual cell to 1R0T. According to the embodiment, the bit line is coupled through each element in the row and a switch at an end of the row is configured to deliver a current through the bit line.

A selectively targeted dynamic read may be used to determine the logical state of a specific ring-shaped element. For instance, in a row having four sequentially numbered ring-shaped elements, the logical state of the second element may be determined with the selectively targeted dynamic read. In operation, a write line is used to ensure that a magnetization direction of a sense layer of the second element is in a first direction. A current is then passed through the bit line to determine a first resistivity value. Next, the write line is used again to switch the magnetization direction of the sense layer of the second element to the second direction (opposite to the first direction). A second current is then passed through the bit line to determine a second resistivity value. The two resistivity values are compared to determine a logical state of the second element. Even though the bit line passes through each element in the row of elements, the difference in the two resistivity values is indicative of the logical state of the second element because the magnetization direction of the sense layer of the second element was selectively switched during the dynamic read process.

13. Multiple Write Lines Configured Through the Center Hole

In each of FIGS. 10, 11, and 12, a single write line was shown passing through each ring-shaped element. However, in a further embodiment, each ring-shaped element may have two or more write-lines passing through. For instance, in an exemplary embodiment, a row write line and a column write line both pass through the ring-shaped element and act in unison to switch a logical state of the element.

For instance, in FIG. 10, write lines 1016 and 1018 may be column write lines. A row write line that passes through each of the ring-shaped elements 1002 and 1004 may be included in the design to provide further select functionality. Similarly, further write lines may be added to FIGS. 11 and 12. Each memory cell may be arranged in a memory array of similar memory cells.

14. Multiple Write Lines for a Two-Element Cell

In some embodiments, a magnetoresistive memory cell for storing a bit of data (0 or 1) includes a pair of ring-shaped elements and multiple write lines. According to an exemplary embodiment, a first ring-shaped multilayer magnetoresistive element is provided having an inner circumference, an outer circumference, a top edge, and a bottom edge, wherein the inner circumference defines a center hole of the element, wherein the multilayer includes a spacer layer sandwiched by a first magnetic layer and a second magnetic layer. Likewise, a second ring-shaped multilayer magnetoresistive element is provided having an inner circumference, an outer circumference, a top edge, and a bottom edge, wherein the inner circumference defines a center hole of the element, wherein the multilayer includes a spacer layer sandwiched by a first magnetic layer and a second magnetic layer. In the cell, three write lines are provided; (i) A row write line is threaded through the center hole of each ring-shaped element and electrically isolated from the elements, the row write line coupled to a power source for providing a row write current; (ii) A first column write is threaded through the center hole of the first ring-shaped element and electrically isolated from the elements; and (iii) a second column write line is threaded through the center hole of the second ring-shaped element and electrically isolated from the elements. When determining a logical state of the memory cell, a current is passed through a bit line that is coupled with the ring-shaped elements such that the current flowing through the bit line passes perpendicularly through the spacer layer of the first ring-shaped element and through the spacer layer of the second ring-shaped element. Further latching mechanisms, switches and write/bit lines may be added to the embodiment.

In operation during a dynamic read of the memory cell (retrieving information), a first write current is passed through the center hole of each ring-shaped element. The first write current is intended to ensure that sense layers of the ring-shaped elements are in a first direction—although in an embodiment, the first direction of one element is opposite to the first direction of the second element. Then, a first read current is sent through the bit line(s) and a first measure obtained. The first read current passes perpendicularly through the spacer layers of the elements. A second write current is then passed through the center hole of each ring-shaped element. The second write current is intended to ensure that the sense layers of the ring-shaped elements are in a second direction—although in an embodiment, the second direction of one element is opposite to the second direction of the second element. Next, a second read current is passed through the bit line(s) and perpendicularly through the spacer layer of each ring-shaped element, whereby a comparison of the first and second sense currents is indicative of information stored at the memory cell. A transistor or set of transistors or switches may be used to trigger the read currents. These transistors may be located within the memory cell or at the edge of the array.

15. Conclusion

A variety of embodiments have been described above. More generally, those skilled in the art will understand that changes and modifications may be made to these embodiments without departing from the true scope and spirit of the present invention, which is defined by the claims. Thus, references to, for example, specific thicknesses, materials, and fabrication methods are meant to be illustrative rather than limiting. Device design, processing, and test conditions all affect magnetization switching characteristics and are therefore should be considered.

The invention claimed is:

1. In a magnetoresistive memory array, a memory cell comprising:
   a first dynamic read ring-shaped multilayer magnetoresistive element having an inner circumference, an outer circumference, a top edge, and a bottom edge, wherein the inner circumference defines a center hole of the element, wherein the multilayer includes a spacer layer sandwiched by a first magnetic layer and a second magnetic layer;
   a row write line threaded through the center hole and electrically isolated from the element, the row write line coupled to a first power source for providing a row write current;
   a column write line threaded through the center hole and electrically isolated from the element, the column write line coupled to a second power source for providing a column write current;
   a bit line coupled in series with the element such that a current flowing through the bit line passes perpendicularly through the spacer layer of the element, wherein the bit line includes a first segment coupled through the first ring-shaped element and a second segment coupled through the second ring-shaped element; and
   a pair of transistors controlled by a select line, wherein each segment of the bit line is coupled to a ground through one of the transistors, whereby activation of the select line closes a circuit allowing a current to pass through the layers of the ring-shaped elements.

2. The memory cell of claim 1, wherein
   the first magnetic layer is a sense layer;
   the spacer layer is a tunneling layer; and
   the second magnetic layer is a storage layer.

3. The memory cell of claim 2, wherein
   the coercivity of the storage layer is greater than the coercivity of the sense layer, and wherein a magnetization direction of the storage layer is indicative of a logical state of the memory cell.

4. The memory cell of claim 1, wherein
   the row write line provides a first half-select write current; and
   the column write line provides a second half-select write current,
   wherein a combined magnetic field created by the first-half select and second half-select write currents is configured to switch a magnetization direction of a storage layer of the ring-shaped element.

5. The memory cell of claim 1, wherein
   the bit line is coupled in series to a plurality of other ring-shaped elements, and
   the bit line is configured to be useful in determining a logical state of the ring-shaped element.

6. The memory cell of claim 4, wherein an autozero sequence is used to determine the logical state of the ring-shaped element.

7. The memory cell of claim 1, wherein the ring-shaped magnetoresistive multilayer element comprises:
   a plurality of ferromagnetic ring layers separated by nonmagnetic spacer ring layers, wherein each ferromagnetic ring layer has a bi-stable magnetic configuration, wherein a magnetization direction associated with each ferromagnetic layer is stable in both a clockwise direction around the hole of the element and a counterclockwise direction around the hole of the element, and
   wherein a resistance across the multilayer element is at a minimum when the magnetization directions associated with the ferromagnetic layers are in a relative parallel orientation, and wherein the resistance is at a maximum when the magnetization directions of the ferromagnetic layers are relatively anti-parallel.

8. In magnetoresistive memory array, a memory cell for storing a bit of data comprising:
   a first ring-shaped multilayer magnetoresistive element having an inner circumference, an outer circumference, a top edge, and a bottom edge, wherein the inner circumference defines a center hole of the element, wherein the multilayer includes a spacer layer sandwiched by a first magnetic layer and a second magnetic layer;
   a second ring-shaped multilayer magnetoresistive element having an inner circumference, an outer circumference, a top edge, and a bottom edge, wherein the inner circumference defines a center hole of the element, wherein the multilayer includes a spacer layer sandwiched by a first magnetic layer and a second magnetic layer;
   a row write line threaded through the center hole of each ring-shaped element and electrically isolated from the elements, the row write line coupled to a power source for providing a row write current;
   a first column write line threaded through the center hole of the first ring-shaped element and electrically isolated from the elements;
   a second column write line threaded through the center hole of the second ring-shaped element and electrically isolated from the elements;
   a bit line coupled with the elements such that a current flowing through the bit line passes perpendicularly through the spacer layer of the first ring-shaped element and through the spacer layer of the second ring-shaped element, wherein the bit line includes a first segment coupled through the first ring-shaped element and a second segment coupled through the second ring-shaped element; and
   a pair of transistors controlled by a select line, wherein each segment of the bit line is coupled to a ground through one of the transistors, whereby activation of the select line closes a circuit allowing a current to pass through the layers of the ring-shaped elements.

9. The memory cell of claim 8, further comprising a latch coupled to the bit line for storing an indication of a logical state of the memory cell.

10. The memory cell of claim 8, wherein the row write line is configured such that a current flowing through generates a first magnetic field acting on the first ring-shaped element and a second magnetic field acting on the second ring-shaped element, wherein the magnetization direction of the first magnetic field is opposite to the magnetization direction of the second magnetic field.

11. The memory cell of claim 10, wherein the column write lines are configured such that a current flowing through the first column write line generates a third magnetic field acting on the first ring-shaped element and the second column write line generates a fourth magnetic field acting on the second ring shaped element, wherein the magnetization direction of the third magnetic field is opposite to the magnetization direction of the fourth magnetic field.

12. The memory cell of claim 11, wherein
the first magnetic field and third magnetic field operate to switch a magnetization direction of a ferromagnetic layer of the first element and
the second magnetic field and fourth magnetic field operate to switch a magnetization direction of a ferromagnetic layer of the second element.

13. The memory cell of claim 8, wherein each ring-shaped magnetoresistive multilayer element further comprises an antiferromagnetic layer coupled to a ferromagnetic layer.

14. The memory cell of claim 8, wherein each ring-shaped magnetoresisitve multilayered element is configured as a dynamic read element.

* * * * *